United States Patent [19]
Bharat

[11] 3,975,753
[45] Aug. 17, 1976

[54] CHARGE COUPLED DEVICE INCLUDING A SLOW-WAVE STRUCTURE FOR PROVIDING CHARGE TRANSFER

[76] Inventor: Ramasesha Bharat, 2905 Echo Hill Way, Orange, Calif. 92667

[22] Filed: Nov. 8, 1974

[21] Appl. No.: 522,162

[52] U.S. Cl. .............................. 357/24; 307/221 D; 307/304
[51] Int. Cl.² ................... H01L 29/78; H03K 3/353
[58] Field of Search ..................... 357/24; 333/31 R; 307/221 D, 304

[56] References Cited
UNITED STATES PATENTS
3,778,643  12/1973  Jaffe ................................. 307/293
3,858,232  12/1974  Boyle et al. .......................... 357/24

OTHER PUBLICATIONS
R. Bharat, "On the Feasibility of Slow-Wave-Structure Clocking of High-Frequency Charge-Coupled Devices", Tech. Rpt. Ecom-4161 (10/73) 16p NTIS AD-768786.
R. Strain, "Properties of an Idealized Traveling-Wave Charge-Coupled Device", IEEE Transactions Electron Devices, vol. Ed-19 (10/72), pp. 1119-1130.

*Primary Examiner*—William D. Larkins
*Assistant Examiner*—Gene M. Munson
*Attorney, Agent, or Firm*—Nathan Edelberg; Jeremiah G. Murray; Frank Dynda

[57] ABSTRACT

A charge coupled device (CCD) wherein clocking or charge transfer at relatively high frequencies is obtained by the use of a slow-wave structure in the form of a metallized meander line fabricated on a relatively thin region of silicon dioxide contiguously formed on the surface of a silicon semiconductor substrate.

9 Claims, 5 Drawing Figures

CHARGE COUPLED DEVICE INCLUDING A SLOW-WAVE STRUCTURE FOR PROVIDING CHARGE TRANSFER

BACKGROUND OF THE INVENTION

1. Field of the Invention

This invention relates to charge coupled device (CCD) technology, and more particularly to a charge coupled device having high charge transfer efficiency at high frequencies, i.e. in the range from 1 to 250GHz.

2. Description of the Prior Art

A new class of monolithic semiconductor apparatus adapted for storing and sequentially transferring electronic signals representing information in the form of packets of excess minority carriers localized in artificially induced potential wells has been disclosed by W. S. Boyle and G. S. Smith, in an article entitled "Charge Coupled Semiconductor Devices," B.S.T.J. Vol. 49, No. 4, April, 1970, pp. 587–593, inclusive. Such apparatus comprises a metal-insulator-semiconductor (MIS) structure wherein a plurality of metal electrodes are disposed in a row over the insulator (dielectric) which in turn overlies and is contiguous with the surface of a semiconductor body. Sequential application of voltages from 1, 2, 3 or 4 phase clocks coupled to the metal electrodes induces potential wells at the interface of the oxide and semiconductor body which act to transfer the charge carriers along the structure in a predetermined direction.

SUMMARY

Briefly, the subject invention is directed to an improvement in CCD devices wherein these devices are adapted to operate at relatively high frequencies and comprises the combination of a slow-wave structure consisting of a metallized meander line formed on the outer surface of a relatively thin region of a dielectric layer, e.g. silicon dioxide formed on the surface of a semiconductor substrate of a selected conductivity type, e.g. N type silicon. Input and output means are included for injecting charge signals into the device and for coupling carriers out of the device at the end of a transfer path. The input and output means comprise, for example, diffused regions of another conductivity type in the substrate forming injection and collection diodes. A single phase periodic signal of regularly varying amplitude (clock signal) is coupled to one end of the meander line by means of an area of metallization formed on a relatively thicker region of the dielectric layer bordering the thin region for launching an electromagnetic wave on the meander line. The meander line itself takes the form of a regularly spaced serpentine line of metallization whose dimensions are selectively chosen in order to implement an electric drift field for synchronously transferring the charge signals along the underlying surface of the semiconductor substrate.

DESCRIPTION OF THE PREFERRED EMBODIMENT

In the interest of additional background information charges introduced into a depletion region under a metal electrode (gate) of a charge coupled device (CCD) are transferred down the CCD line by pulsing the gates with single or multiple phase clock signals depending upon the design of the CCD. Typically, most of the charge transfer takes place during the initial part of the clock pulse when the space charge induced fields are high in the transfer region. During the latter part of the pulse when the residual charge is transferred, the rate is limited principally by diffusion. Thus the major portion of the charge spends a considerable fraction of the time resting in a well waiting for the residual charge before starting on the next transfer. Though fringing fields between electrodes do contribute to a speed-up of the transfer of residual charge, the potentials near the center of the electrodes are relatively flat so that diffusion still governs the rate of charge transport.

Figure 1A:
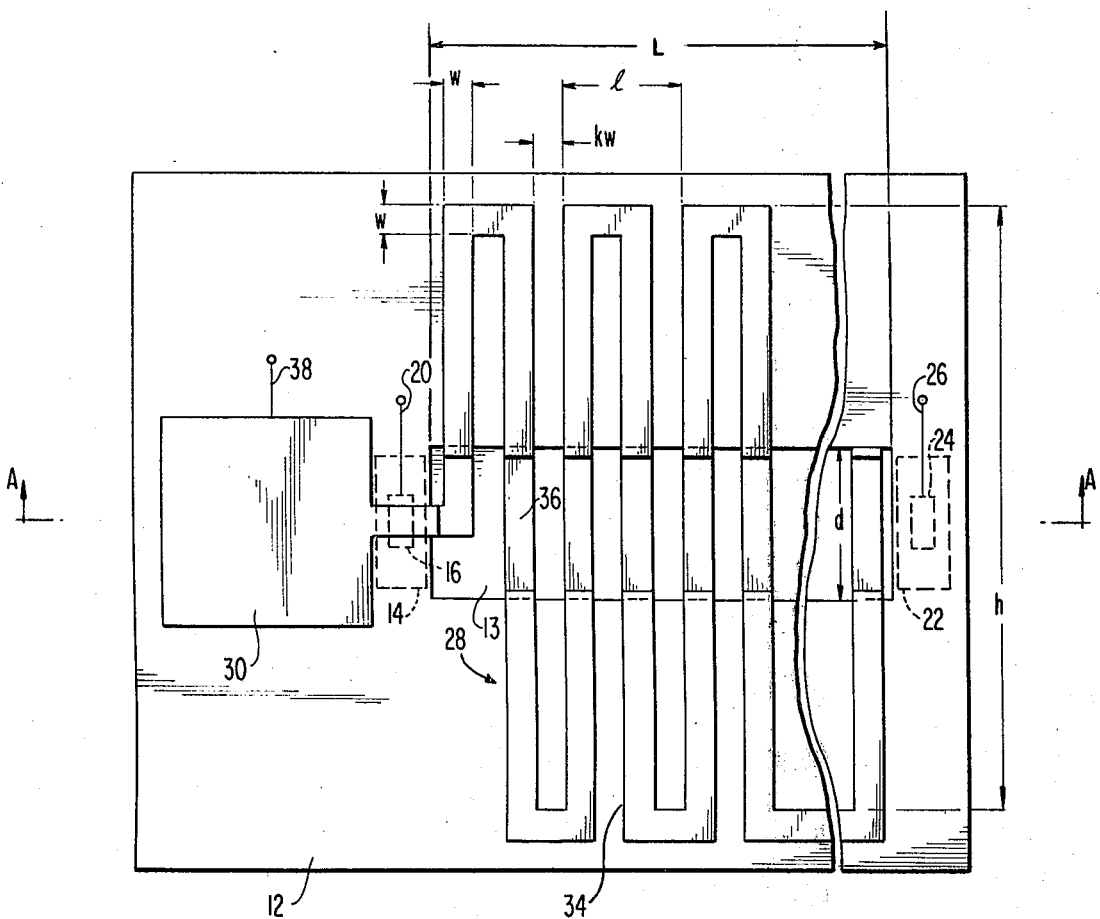
FIGS. 1A and 1B comprise a plan view and a cross sectional view taken along the line A—A, respectively, of the preferred embodiment of the subject invention.
Figure 1B:
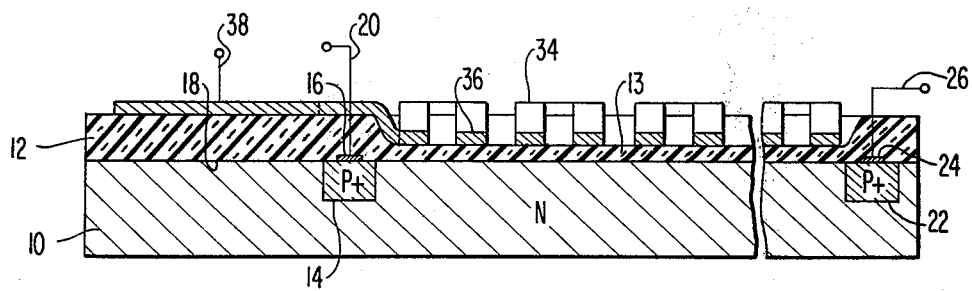

Referring now to the preferred embodiment of the subject invention, attention is directed to FIGS. 1A and 1B wherein a common substrate 10 is shown formed of a semiconductor such as N-type silicon. This is shown for purposes of illustration only, and is not meant to be considered in a limiting sense, since other alternatives are possible. A thin film of dielectric material such as one formed of silicon dioxide ($SiO_2$) is located on the surface of the semiconductor substrate. The film includes a relatively thick oxide region 12 bordering a relatively thin generally rectangular oxide region 13 of predetermined length L and width d under which charge signals, e.g. minority charge carriers are adapted to move. The actual thickness of the thin oxide region 13 may be from 500 to 2000 angstroms (A) while the relatively thick oxide region 12 may be 10,000A or more. Input means for injecting minority carriers is shown for purposes of illustration comprising a diode formed of a diffused region 14 of P+ semiconductivity formed in an N-type substrate 10 at the transition between the thick and thin oxide regions at one end of the L dimension. A metal electrode 16 is formed at the substrate 10 above the P+ region 14. An electrical input lead 20 is connected to the electrode 16 for coupling to a source, not shown, of charge signals. Output means are additionally included and is shown for purposes of illustration comprising a collection diode formed of a second diffused P+ region 22 at the opposite end transition of the oxide regions. A metal electrode 24 is formed at the surface over the region 22 and an output lead 26 is coupled to the electrode 24 for coupling charge signals from the CCD line.

On the surface of the silicon dioxide layer as shown in FIG. 1A is formed a charge signal transfer electrode or gate comprised of a layer of metallization such as aluminum configured into a slow-wave structure in the form of a meander line transmission line 28 which is adapted to run back and forth over the thin oxide region 13 at regularly spaced separations and a contact area 30 connected to the input end of the line 28. The meander line 28 consists of a serpentine transmission line of a constant width w having substantially square corners. Connected traversing line segment 34 of a median length h have their outer portions raised due to the thickness of the thick oxide region 12 whereas the respective inner portions 36 of each segment 34 dips inwardly due to the reduced thickness of the relatively thinner oxide region 13. The meander line 28 has a relatively constant separation kw between line segments wherein $k = 1$. The pitch $l$ which is the distance from one line segment to its nearest like segment is shown equal to $2kw + 2w$. It can be seen from the FIG. 1A that the dimension $d$ is slightly larger than the span of the inner portion 36 of the traversing line segments 34. The metallization contact area 30 connects to an electrical lead 38 to which is connected a clock source, not shown, providing a single phase periodic signal of regularly varying amplitude such as a sine wave for launching a traveling wave along the meander line 28 toward the collection diode comprising the diffused region 22.

Figure 2:
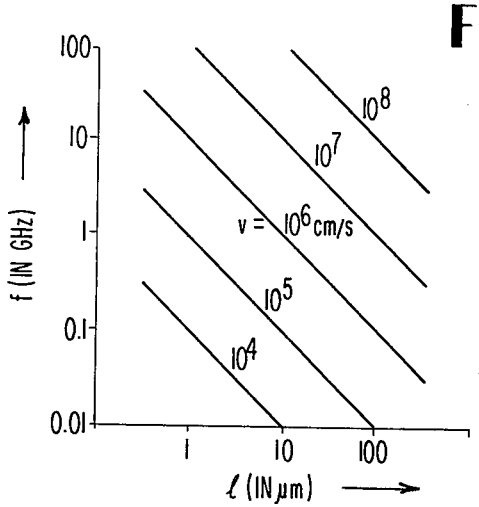
FIG. 2 is a graph illustrating the relationship of synchronizing frequency ($f$) vs. bit length ($l$) and carrier velocity ($v$)

Considering now the principle of operation and assuming a sinusoidal variation of the clock signal applied to the lead 38, an electric field E travels at a certain velocity $c$ down the meander line 28, whereupon the charge signals, e.g. minority carriers injected into the structure adjacent the end of the meander line constantly experience a drift field as the wave propagates during the entire clocking cycle with no regions in the semiconductor being field free. Under these conditions, there is no residual charge and hence no loss in signal except due to the presence of surface states. Regarding the preferred embodiment of the invention shown in FIGS. 1A and 1B, and the conditions necessary for synchronizing the velocity of the electromagnetic wave propagated along the meander line 28, having a bit length $l$, with the drift velocity $v$ of the charge carriers, if the charge carriers are assumed to move along the channel of the interface 18 beneath the thin oxide region 13 at a uniform velocity, then the frequency $f$ of the sinusoidal clock signal in order to provide a synchronous traveling electric field is expressed as:

$$f = \frac{v}{l} \quad (1)$$

meaning $l$ should be the wavelength for the traveling wave launched at the input means. The relationship expressed by equation (1) is furthermore illustrated in the graph of FIG. 2 for different values of $v$. It can be seen that operation at low frequencies requires either low charge carrier velocities or large bit lengths or both. Large bit lengths, however, are undesirable from a point of view of processing yield if a long CCD configuration is required, since the overall length L of an N bit CCD device is $Nl$. The carrier velocity $v$ on the other hand depends on the electric field E along the channel. In the low field region, this can be expressed by the equation:

$$v = \mu E \quad (2)$$

where $\mu$ is defined as the carrier mobility. As the field E is varying with position along the length L, a velocity distribution is set up which tends to bunch all the charges around the peak of the field distribution. After the initial transient required to reach this condition, charges can all be considered to travel at the velocity corresponding to the peak electrical field $E_m$. At relatively low electrical fields, therefore, the frequency for synchronization can be expressed as:

$$f = \frac{\mu E_m}{l} \quad (3)$$

Thus the device will operate only at one specifically applied voltage corresponding to $E_m$ for the peak of the channel field. This condition is usually not desirable unless provisions are made for stabilizing the frequency.

It becomes obvious then that the configuration shown in FIGS. 1A and 1B is not conducive or feasible for low operating frequencies. Operation at high frequencies furthermore require high velocities $v$ and/or small bit lengths $l$. The carrier velocity, however, cannot be increased indefinitely in solids. In silicon (Si) its dependence on the electrical field E becomes sublinear at high fields, and finally reaches a constant saturation velocity $v_s$. The frequency for synchronism then is defined by the equation:

$$f = \frac{v_s}{l} \quad (4)$$

Operation at saturation velocities has the merit that the synchronous frequency becomes independent of the applied voltage and is set only by the material and the bit length $l$. If $E_s$ is the minimum electric field required to obtain the saturation velocity $v_s$, then any drive or clock voltage which produces a channel field $E > E_s$ will be acceptable for operation. The minimum bit length $l$ on the other hand is determined by the state of the art technology.

The present invention is particularly adapted for clocking at high frequencies in the gigahertz (GHz) range, i.e. 1 to 250GHz. Defining the velocity of the electromagnetic wave to be launched on the slow-wave structure to be $c_o$ in a vacuum, the wave must be slowed down to the carrier saturation velocity $v_s$ in order to obtain synchronism. This slow-down factor of $c_o/v_s$ is achieved in two steps. First of all, the layered structure of silicon dioxide ($SiO_2$) on silicon (Si) will have an effective refractive index n at the frequency of operation, resulting in a wave velocity $c = c_o/n$ in the material. Secondly, the configuration of the meander line 28 is designed to provide a factor of $c/v_s$. This is obtained in the following manner. Noting that $$l = 2(w + kw) \quad (5)$$

then the electromagnetic wave propagating on the meander line 28 has to travel a distance of $(2h + l)$ along the meander line of N bits in order to advance a distance L/N along the length L of the thin oxide region 13. Defining the effective velocity of propagation of the wave as $\mu$ in the lengthwise direction L, the effective wave velocity is slowed by a factor of $(2h + l)/l$. Thus $$\frac{c_o}{\mu} = \frac{n(2h + l)}{l} \quad (6)$$

or $$\frac{h}{l} = \frac{1}{2}\left(\frac{c_o}{n\mu} - 1\right) \quad (7)$$

Figure 3:
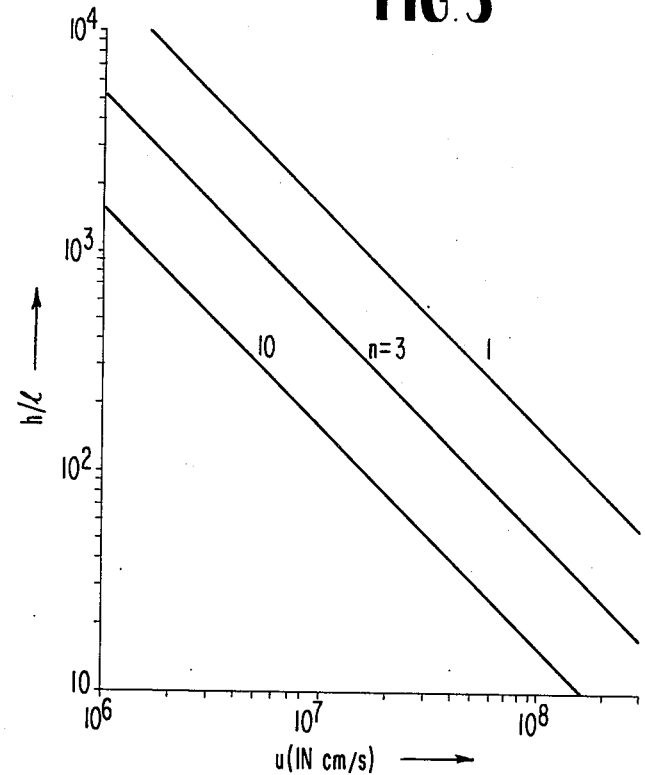
FIG. 3 is a graph illustrating a relationship of the aspect ratio ($h/l$) of the meander line shown in FIGS. 1A and 1B as a function of propagation velocity ($\mu$) for various effective refractive indices ($n$)

FIG. 3 illustrates the relationship of $h/l$ which is the aspect ratio of the meander line 28 as a function of $\mu$ for different values of the effective refractive index $n$. Rewriting equation (5) as $$l = 2w(1 + k) \tag{8}$$

The metallization ratio can be expressed as:

$$\frac{h}{w} = (1 + k)\left(\frac{c_o}{n\mu} - 1\right) \tag{9}$$

At synchronism of the electromagnetic wave launched on the meander line 28 with the carriers drifting at the saturation velocity $v_s$, $\mu = v_s$ exists. As such, equation (7) becomes $$h = \frac{1}{2}\left(\frac{c_o}{nv_s} - 1\right)l \tag{10}$$

whereupon equation (9) becomes $$\frac{h}{w} = (1 + k)\left(\frac{c_o}{nv_s} - 1\right) \tag{11}$$

With a sinusoidal field distribution of minimum required electrical field $E_s$ in the channel, the required peak-to-peak potential difference in the channel is given by $$\phi_{pp} > l\,\frac{E_s}{\pi} \tag{12}$$

In order to obtain this value in the channel region 13, however, an even larger voltage swing is needed on the meander line 28 as a practical matter in order to account for the space charge distribution in the metal oxide semiconductor structure under deep depletion.

The energy required to move the charge carrier synchronously with the electric field must be supplied by the clock supply connected to the lead 38. If the charge being transferred in one bit $l$ of the CCD shown in FIGS. 1A and 1B is Q, then the power dissipated per bit is given by the equation $$P_R = Q\,E_s\,v_s \tag{13}$$

It can be seen therefore that due to the operation at saturation velocity, $v_s$, the power dissipation is independent of the frequency. At low E fields the low velocity is not constant so that $f$ and $l$ can be chosen independently and the power dissipation becomes $$P_R = Q\,Ev = \frac{Q\,v^2}{\mu} = \frac{Q\,l^2 f^2}{\mu} \tag{14}$$

The dissipation therefore varies as the square of the frequency. However, under velocity saturation $v_s$, the frequency is independent of the electrical field so that the loading of the clock line by the signal charges does not cause frequency pulling.

From a practical standpoint, saturation velocity $v_s$ for electrons in silicon is typically about $10^7$cm/sec. This value is reached above E fields in the order of $2 \times 10^4$ volts/cm. The corresponding values for holes on the other hand is $7.5 \times 10^6$cm/sec. for E fields in the order of $4 \times 10^4$ volts/cm. With present technology, line widths as small as $2.5\mu$m (0.1 mil) can now readily be obtained. This then should equal the smaller of the two dimensions $w$ and $kw$. Assuming for sake of illustration that $k = 1$, then the bit length $l$ would be $10\mu$m, and from equation (4) the frequency $f$ for an N channel charge coupled device would be 10GHz. From equation (12), the value of $\phi_{pp}$ would be 6.4 volts. For charge coupled devices having an oxide thickness of the region 13 in the order of 1000 to 2000A and substrate doping in the order of $10^{15}$cm$^{-3}$ the surface potential would convert to a minimum gate voltage swing of approximately 8 volts. If the substrate is n type (P type) silicon, the positive (negative) voltage swings on the gate would tend to form an accumulation region; however, this can be avoided by suitably biasing the gate with respect to the substrate and letting the high frequency clock voltage ride on the DC bias. The relative dielectric constants of silicon and silicon dioxide are about 11.7 and 3.9, respectively; however, the effective refractive index $n$ of the layered structure must be calculated for the specific oxide thickness and frequency of operation. Assuming a value of $n = 3$, the carrier velocity $c_o$ is in the order of $10^{10}$cm/sec. From equation (11), the metallization ratio $h/w$ then becomes equal to 1998 for metal lines. This is a relatively large aspect ratio, and the metallization requires careful control, but the dimensions involved are within the state of the art of current technology. It should also be stated that for values of $k$ other than 1, the synchronism frequency would be reduced by the factor $2/(1 + k)$. The required voltage swing would be increased by the factor of $(1 + k)/2$ and the metallization ratio $h/w$ would also be increased by a factor of $(1 + k)/2$.

Figure 4:
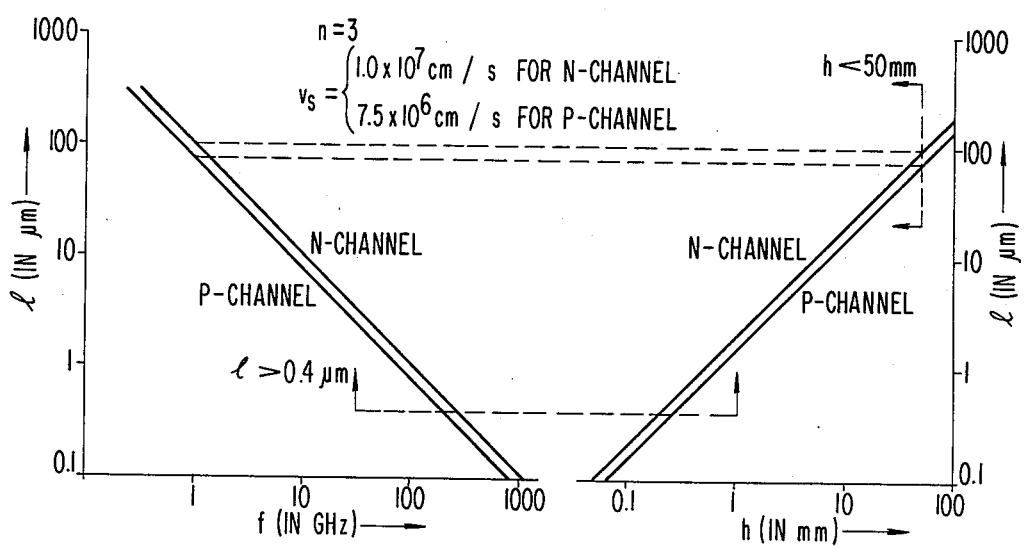
FIG. 4 is a pair of graphs illustrating the design relationships for meander line clocking of silicon CCD devices.

Considering FIG. 4 in view of the parameters set forth above and by specifying the desired frequency of operation, the values of $l$ and $h$ required can be obtained therefrom. By setting practical limits on $h$ and $l$, the range of frequency suited for this mode of operation can be determined. For example, where $h$ is less than 50mm and $l$ is greater than $0.4\mu$m, the frequency range is seen to be 1 to 250GHz for N channel charge coupled devices and 1 to 190GHz for P channel devices fabricated in silicon. Operation at higher frequencies would require a smaller $l$ and a smaller $w$ which is relatively more difficult to achieve, but also a smaller $h$ results which is relatively easier to achieve. A smaller line width $w$ can be obtained through the use of electron beam etching particularly since multiple masking is not involved in the critical metallization step. With line width and spacing of $0.25\mu$m each, the required $h$ for the meander line shown in FIGS. 1A and 1B would be $499.5\mu$m, resulting in a possible clocking frequency of 100GHz. Using as small a line width $w$ as possible would also reduce the length L required for the CCD. For a 1000 bit device with the line width $w = 2.5\mu$m wherein $k = 1$, the total length $L = Nl$ would be 10mm, exclusive of the space required for the charge input and output circuits. Any tap that may be required for accessing the signal at any point along the meander line would have to be in the form of a floating gate or a floating diffusion within the bit length as the bit spacing has to stay constant in order to maintain synchronism.

In order to reduce the likelihood of the charge coupled device being made inoperative by pin holes in the oxide, the area of the thin oxide region 13 shown in FIGS. 1A and 1B should be kept as small as possible. Hence, the width d of the oxide region 13 is chosen to be only slightly larger than the line segments 36 of the meander line 28. With the geometry shown, the oxide region 12 is a relatively thicker outside of the active area defined by the thin oxide region 13. While this has the merit of reducing pin holes in the oxide which may lead to shorting of the metal to the surface of the substrate 10, it will tend to increase the defects in the metallization as each of the narrow metal lines 34 has to go through two steps on the oxide layer, thus defining the segments 36. These defects at the steps are more likely to be open circuits but will not make the device inoperative unless they become too numerous, since there would be adequate coupling through small gaps at high frequencies in the gigahertz range. It should be borne in mind therefore that effective refractive index $n$ will depend on the oxide thicknesses forming the two steps and the relative values of $d$ and $h$ in addition to the refractive indices of silicon dioxide and silicon. Obtaining as high an effective refractive index for the structure as possible would help in reducing the required metallization ratio.

In the embodiment shown in FIGS. 1A and 1B, all of the charge signals move in synchronism with the peak of the traveling drift field. Thus, charge transfer is complete. Furthermore, there is no delay charge due to filling or emptying of surface states, since the time constants for the interaction of charges with surface states are too large compared to the clocking periods the high frequencies used in the present invention. Accordingly, charge transfer efficiency approaches 100 percent. This is of particular significance for analog applications where signal distortion will occur if different samples of the signal are attenuated differently by the structure. Improved charge transfer efficiency will also allow processing of lower signal levels, thus reducing power consumption.

It should be noted that the preferred embodiment disclosed utilizes a silicon dioxide on silicon system. The reason for this is that it is presently possible to grow thin, uniform relatively pin hole free oxides on silicon. This disclosure, however, is not meant to be considered in a limiting sense, since when desirable other materials may be utilized. Materials other than silicon, for example, may be used for the substrate such as germanium, gallium arsenide, etc. while the dielectric might be silicon nitride. This would allow the use of charge coupled devices in applications where it would be advantageous to combine on a single substrate both CCDs and the functions to which the specific properties of any of these materials are particularly suited.

Thus what has been shown and described is a means for clocking charge coupled devices by a traveling electromagnetic field coupled through a slow-wave structure. With a meander line used for clocking a charge coupled device fabricated on a silicon substrate, operational frequencies in the 1 to 250GHz range are feasible. Several advantages inherently result from this approach. First of all, clocking is greatly simplified in that only one clock driver is needed and no pulse shaping is required because the drive signal preferably comprises a single phase sine wave. Thus the necessary phase relationships along the CCD line are automatically obtained in the structure. Secondly, charge is transferred in synchronism with the field thus eliminating the diffusion inefficiency in transfer. Also due to the high frequency of operation obtainable, trapping of carriers by surface states will be mostly ineffective, thus greatly reducing the surface state limited inefficiency in transfer. Since the charge transfer efficiency approaches 100 percent, the device will maintain even at these relatively high frequencies the feature of being effective as an analog device. Finally, due to the ineffectiveness of surface traps at these relatively high operating frequencies charge coupled device operation becomes practical in materials other than silicon.

Having thus described what is at present considered to be the preferred embodiment of the subject invention,

I claim:

1. In a charge coupled device having means for injecting charge signals and means for collecting said charge signals comprising:

a semiconductor substrate of one conductivity type;

a layer of dielectric material overlying the surface of said substrate and having a region of predetermined thickness, length and width, under which charge signals are adapted to move from said injecting means to said collecting means;

a slow-wave means, including a meander line electrical transmission line formed from a layer of metallization having a continuous serpentine configuration describing a plurality of interconnected line segments crossing the lengthwise dimension of said region at regularly spaced intervals in a parallel fashion and wherein said parallel line segments have a constant width dimension and equal separation therebetween and wherein said width dimension of said line segments is equal to said separation, configured to propagate an electromagnetic wave therealong, for producing an electric drift field under said dielectric layer in said region for controlling the movement of said charge signals from said injecting means to said collecting means; and means coupling a periodic signal of regularly varying amplitude to said slow-wave structure for launching said electromagnetic wave therealong;

the improvement wherein:

said line segments traverse said region normal to said length dimension of said region and have a respective length dimension substantially greater than said width dimension of said region.

2. The charge coupled device as defined by claim 1 wherein said layer of dielectric material includes a region of predetermined thickness greater than said first recited region bordering said first recited region.

3. The charge coupled device as defined by claim 2 wherein said means coupling said periodic signal comprises an area of metallization fabricated on said region of relatively greater predetermined thickness, said area being connected to one end of said meander line.

4. The charge coupled device as defined by claim 3 wherein said parallel line segments are serially interconnected by respective mutually parallel line segments thereby providing a meander line having substantially square corners.

5. The charge coupled device as defined by claim 4 wherein said semiconductor substrate is comprised of silicon and said dielectric layer is comprised of silicon dioxide.

6. The charge coupled device as defined by claim 1 wherein said region of predetermined thickness includes a length dimension L and a width dimension d and wherein said slow-wave structure comprises a meander line of constant width w and consisting of a plurality of series connected line segments having a median length h crossing and length dimension of said region at equally spaced intervals and wherein the ratio of $$h/w = (1 + k) \left( \frac{c_o}{nv_s} - 1 \right),$$

where $k$ is a constant equal to the ratio of the spacing between line segments to the width of the line segments, $c_o$ is the velocity in a vacuum of the electromagnetic wave coupled to said meander line, $n$ is the effective refractive index of the semiconductor substrate and dielectric combination, and $v_s$ is the saturation velocity of said charge signals under a condition of synchronism with the periodicity of said periodic signal.

7. The charge coupled device as defined by claim 6 wherein the width dimension $d$ of said region of predetermined thickness is substantially less than $h$.

8. The charge coupled device as defined by claim 7 wherein said layer of dielectric material additionally includes a region of greater predetermined thickness surrounding the first recited region of predetermined thickness, wherein said coupling means includes an area of metallization on said region of greater predetermined thickness, wherein said means for injecting charge signals is located between said area of metallization and one end of said meander line, and wherein said collecting means is located adjacent the other end of said meander line.

9. The charge coupled device as defined by claim 6 wherein said periodic signal comprises a sinusoidal signal.

* * * * *

UNITED STATES PATENT AND TRADEMARK OFFICE
CERTIFICATE OF CORRECTION

PATENT NO. : 3,975,753
DATED : 17 Aug 1976
INVENTOR(S) : RAMASESHA BHARAT

It is certified that error appears in the above--identified patent and that said Letters Patent are hereby corrected as shown below:

In column 1, at line 6, as the first sentence after "Background of the Invention" insert this sentence:

"The Invention herein described was made in the course of or under a contract or subcontract thereunder, (or grant) with the Department of the Army."

Signed and Sealed this

Twenty-first Day of February 1978

[SEAL]

*Attest:*

RUTH C. MASON
*Attesting Officer*

LUTRELLE F. PARKER
*Acting Commissioner of Patents and Trademarks*